June 19, 1962 J. M. WERNLI 3,039,377

VENTILATING SYSTEM FOR ELECTRONIC APPARATUS

Filed Aug. 13, 1959

INVENTOR.
JOHN M. WERNLI

BY
Flehr & Swain
ATTORNEYS

United States Patent Office
3,039,377
Patented June 19, 1962

3,039,377
VENTILATING SYSTEM FOR ELECTRONIC APPARATUS

John M. Wernli, Menlo Park, Calif., assignor to Ampex Corporation, Redwood City, Calif., a corporation of California Filed Aug. 13, 1959, Ser. No. 833,468
3 Claims. (Cl. 98—1)

This invention relates generally to a ventilating or cooling system for electronic apparatus of the type which employs a plurality of removable component circuits.

With the advent of printed circuit techniques and transistors, the over-all configuration of many electronic circuits has been considerably changed. In general, by employing these new circuit elements, component circuits can be formed in which the various circuit elements are carried on a board which includes the leads for making the necessary circuit connections with associated elements. Different circuits may be formed on different boards. The component circuits can include terminal strips which are engaged by accommodating strips formed in a chassis.

Thus, it is possible to form a complex circuit by employing a plurality of plug-in component circuits which are easily interchangeable for servicing.

Generally, each of the component circuits is housed in its own housing to protect the parts and for ease of handling. When employing such a modular technique, however, it is relatively difficult to provide suitable cooling for each of the component circuits. If one were to provide a blower for each of the component circuits, the overall equipment would be exceedingly bulky and expensive. On the other hand, by providing a single blower blowing into the chassis, the various component circuits are not efficiently cooled.

It is a general object of the present invention to provide a cooling system for electronic apparatus which overcomes the aforementioned difficulties.

It is another object of the present invention to provide a ventilating system in which plug-in component circuits are adapted to register with a plenum which supplies cooling air thereto and which is fed by a master blower.

These and other objects of the invention will become more clearly apparent from the following description when taken in conjunction with the accompanying drawing.

Referring to the drawing.

Figure 1:
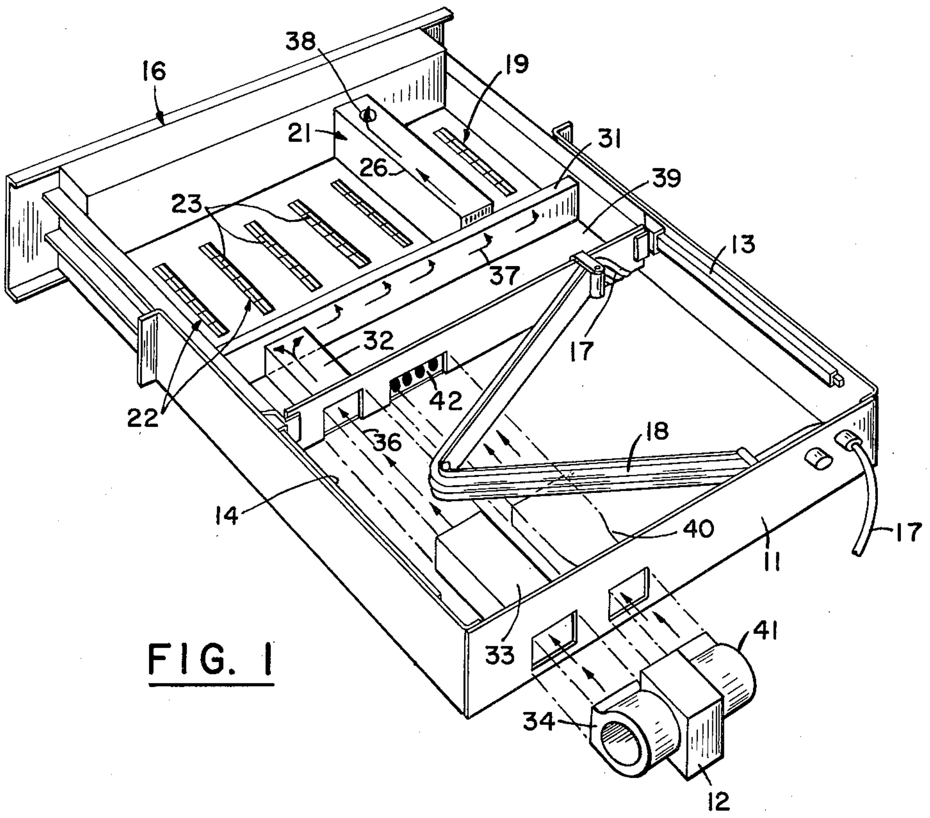
FIGURE 1 shows a chassis which is adapted to receive a plurality of component circuits to form a complex circuit.

Referring to FIGURE 1, the apparatus illustrated includes a main chassis 11 which supports the dual blower 12. The chassis includes spaced tracks 13 and 14 which slidably receive a drawer-like chassis 16. Electrical connection between the components in the chassis 16 and associated apparatus may, for example, be made through cables 17 which are disposed behind the chassis 15 and carried by the hinged cable support 18.

The chassis 16 illustrated includes a first compartment 19 which is adapted to accommodate a plurality of component circuits 21. One such circuit is shown and other circuits are inserted into the accommodating portion and adapted to make electrical connection to the contact elements 22 carried at the bottom of the compartment 19. The contact elements 22 may, for example, comprise a plurality of spaced contact fingers 23 adapted to make contact with associated component circuit prongs.

Figure 2:
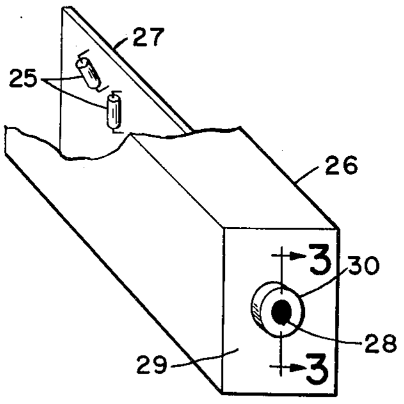
FIGURE 2 shows a typical component circuit.
Figure 3:
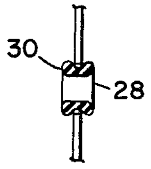
FIGURE 3 is a view taken along the line 3—3 of FIGURE 2 showing a suitable gasket.

Each of the component circuits may, for example, include a housing 26, FIGURE 2, which houses a printed circuit board 27 carrying a plurality of circuit elements 25 which form the component circuits. One end of the housing 29 is provided with an opening 28 and a suitable gasket, for example, a grommet 30 as shown in FIGURE 3.

When the component circuit is inserted in the accommodating portion 19 and makes electrical contact with the contact strip, the grommet 30 makes yieldable contact with the adjacent surface of a plenum chamber 31 which carries spaced openings adapted to register with the opening 28 in the housing.

A tube 32 communicates between the plenum 31 and the tube 33 associated with the blower 34. When the drawer 16 is closed, the tubes 32 and 33 register and air is blown inwardly as indicated by the arrows 36 into the plenum outwardly through the spaced openings as indicated by the arrows 37 through the housings 26 and out the openings 38. Thus, efficient cooling of the various component circuits which are inserted is achieved.

The drawer illustrated includes a second compartment 39 which might, for example, accommodate a power supply. When the drawer is closed, the tube 40 associated with the blower 41 serves to cause air to flow inwardly through the opening 42 and to be distributed to cool the circuits carried in the compartment 39.

Thus, it is seen that there is provided an improved cooling system, particularly for complex circuits made up of a plurality of component circuits.

I claim:

1. A cooling system for electronic apparatus of the type that includes a frame mounting a plurality of electrical contact elements and a plurality of component circuits each encased in a separate housing and making electrical connection with respective ones of said contact elements, comprising: a plenum chamber mounted on said frame and engaging all of said housings, said chamber being provided with a plurality of first openings each confronting one of said housings; each of said housings being provided with a second opening registering directly with the corresponding one of said first openings; and means for supplying air to said plenum chamber whereby the air flows through said openings into the adjacent component circuit housings to cool the same.

2. An electronic apparatus comprising: a main chassis; a blower assembly mounted on said main chassis; an air duct mounted on said main chassis and extending from said blower into the interior of said main chassis; a drawer-like chassis mounted in said main chassis; means carried by said main chassis for guiding said drawer-like chassis in sliding movement into and out of said main chassis and toward and away from said blower assembly and air duct, said drawer-like chassis having a plurality of spaced electrical contact element strips extending in the direction of movement of said drawer-like chassis; a corresponding plurality of component circuits mounted on said drawer-like chassis and each in electrical contact with one of said electrical contact element strips; a housing having an opening in one end wall for each component circuit; a plenum chamber mounted on said drawer-like chassis and extending transversely to the direction of movement of said drawer-like chassis contiguous to said strips, said plenum chamber having a first opening registering with the extending end of said air duct when said drawer-like chassis is fully inserted into the main chassis, and said plenum chamber having a plurality of second openings each confronting an opening in one of said housings and the corresponding component circuit for cooling said component circuits.

3. Apparatus as in claim 2 wherein each of said component circuits includes a housing having a first opening in one wall thereof, said first openings being adapted to register with an associated second opening formed in the plenum chamber, and each of said housings having a third opening remote from the first opening thereof for escape of cooling air.

References Cited in the file of this patent

UNITED STATES PATENTS

| | | |
|---|---|---|
| 2,335,173 | Corey | Nov. 23, 1943 |
| 2,394,060 | Holmes | Feb. 5, 1946 |
| 2,734,441 | Williams | Feb. 14, 1956 |
| 2,825,500 | McLean | Mar. 4, 1958 |